(12) United States Patent
Clark et al.

(10) Patent No.: US 12,114,422 B2
(45) Date of Patent: Oct. 8, 2024

(54) HIGH VOLTAGE GATE DRIVE CIRCUITRY

(71) Applicant: BAE Systems Controls Inc., Endicott, NY (US)

(72) Inventors: Andrew S. Clark, Binghamton, NY (US); Robert J. Vovos, Vestal, NY (US)

(73) Assignee: BAE Systems Controls Inc., Endicott, NY (US)

( * ) Notice: Subject to any disclaimer, the term of this patent is extended or adjusted under 35 U.S.C. 154(b) by 109 days.

(21) Appl. No.: 18/067,316

(22) Filed: Dec. 16, 2022

(65) Prior Publication Data
US 2024/0206056 A1  Jun. 20, 2024

(51) Int. Cl.
H05K 1/02 (2006.01)
H05K 1/18 (2006.01)

(52) U.S. Cl.
CPC .......... *H05K 1/0286* (2013.01); *H05K 1/181* (2013.01); *H05K 2201/10022* (2013.01); *H05K 2201/10166* (2013.01)

(58) Field of Classification Search
CPC ...... H05K 1/02; H05K 1/0263; H05K 1/0268; H05K 1/115; H05K 1/118; H02M 1/38; H02M 1/088; H03K 17/60; H03K 17/133; H03K 17/687; H03K 17/6871; H03K 17/284
USPC .................................................. 361/781–784
See application file for complete search history.

(56) References Cited

U.S. PATENT DOCUMENTS

| | | | |
|---|---|---|---|
| 7,612,602 B2 * | 11/2009 | Yang | H02M 1/08 327/494 |
| 10,680,520 B2 * | 6/2020 | Davison | H02M 3/1582 |
| 10,897,251 B1 * | 1/2021 | Ionascu | H02M 1/08 |
| 10,903,834 B1 * | 1/2021 | Lemberg | H05K 1/0263 |
| 2004/0085790 A1 | 5/2004 | Porter et al. | |

(Continued)

OTHER PUBLICATIONS

Zheng, Z., et al., "A practical example of hard paralleling SiC MOSFET modules", PCIM Asia 2019, Jun. 26-28, 2019, pp. 108-114.

(Continued)

*Primary Examiner* — Tuan T Dinh
(74) *Attorney, Agent, or Firm* — Scully Scott Murphy & Presser PC; Gary McFaline

(57) ABSTRACT

A gate drive topology and gate drive power supply topology designed to allow for a single Printed Wiring Board (PWB) design to be configured for two applications. In one application, select paired locations of solder pads or connector locations in the circuitry are populated with connecting "spanning" resistors for integration within the gate driver and gate driver power supply topologies. The physical manifestation of these resistors on the PWB allows paralleled gate drive switching of corresponding power transistor devices for driving a load. A common gate-source voltage is applied to all three gates and the switching devices share dynamic switching and conduction loss. In an alternate application, the select paired locations are not populated with spanning resistors thereby rendering a circuit topology permitting independent operation independent power transistor gate driving switching operations. The path across the unpopulated spanning resistors provides a high voltage creepage isolation between independent gate driver circuits.

10 Claims, 10 Drawing Sheets

(56) References Cited

U.S. PATENT DOCUMENTS

| | | | | |
|---|---|---|---|---|
| 2011/0309809 A1* | 12/2011 | Rao | .................. | H02H 9/001 |
| | | | | 323/282 |
| 2016/0336442 A1* | 11/2016 | Nielsen | ................ | H03F 3/2171 |
| 2018/0248540 A1* | 8/2018 | Ishii | ...................... | H03K 3/013 |
| 2019/0140631 A1* | 5/2019 | Manohar | ............ | G06F 13/4282 |
| 2020/0366182 A1* | 11/2020 | Bieber | .................. | H03K 17/14 |
| 2021/0067097 A1 | 3/2021 | Wang et al. | | |
| 2022/0354014 A1* | 11/2022 | Feurtado | ............ | H05K 1/0271 |

OTHER PUBLICATIONS

Texas Instruments. "Isolated IGBT Gate-Drive Power Supply Reference Design With Integrated Switch PSR Flyback Controller" Texas Instruments; Article [online]. Sep. 2018 [retrieved Mar. 11, 2024]. Retrieved from the Internet: https://www.ti.com/lit/ug/liduea3/tiduea3.pdf?ts=1710167508014ref_url=https%253A %252F%252Fwww.google.com%252F.

International Search Report, PCT/US23/82441, mailed Apr. 15, 2024, 6 pages.

\* cited by examiner

HIGH VOLTAGE GATE DRIVE CIRCUITRY

FIELD OF THE DISCLOSURE

This disclosure relates to power converters for vehicles such as battery electric vehicles and hybrid electric vehicles. More particularly, this disclosure relates to a single printed wiring board (PWB) for use in a power conversion module, the single PWB having plural power supplies and associated gate driver unit circuits for controlling switching power transistor devices used to drive vehicle loads, the PWB configurable for two applications: 1) a first topology for independent gate driver power switching operation or 2) in a second topology for driving parallel-connected power transistor switches.

BACKGROUND

Battery electric vehicles and hybrid electric vehicles have an electric machine such as a permanent magnetic (PM) electric machine or induction machine (IM) electrically connected to an inverter. The electric machine is also mechanically connected to wheel axle(s) or turbine of the vehicle via a one or more mechanical connections.

A low voltage battery in the vehicle provides a first voltage. The first voltage is used to seed a primary or main power supply for the inverter. The main power supply generates a plurality of gate driver rails used to power two or more gate driver circuits to drive pairs of semiconductor switches of a power inverter. The pairs of semiconductor switches are connected in a half-bridge (h-bridge) configuration between a high voltage DC bus (DC+ and DC-). The inverter may have one or more pairs of the semiconductor switches.

The low voltage battery is also used to seed a plurality of control power rails used to control the inverter. The inverter may also comprise a propulsion control unit such as a primary controller. The primary controller may receive torque and/or speed command(s) from another controller and generate commands to the gate driver circuitry. The torque and/or speed command(s) from this controller may be received via a communication interface, such as a control automation network (CAN). The control power rails provide power for the primary controller and the communication interface.

In operation and when the vehicle is ON, the primary controller and communication interface, receive the respective control power rails, which are in a predetermined range, and supplies the appropriate command to the gate driver circuits. The gate driver circuits, which are supplied with the gate driver rails, controls the gates of the semiconductors switches to turn ON/OFF to control the electric machine (a controlled state).

With respect to gate driver circuits, these circuits typically include a gate driver controller integrated circuit (IC) coupled to associated gate driver signal processing circuits that all receive power supply rail voltages generated from an associated power supply rail unit and provide the signals for independently controlling switching operations of the power transistors.

Inverters comprise a plurality of pairs of semiconductor switches. Each pair may be connected in a half bridge configuration between a positive bus (DC+) and a negative bus (DC-) (also known as HIGH and LOW). Each pair of semiconductor switches may be independently controlled to turn ON and OFF, causing square waves of voltage to be produced (output). Each pair of semiconductor switches may independently output a phase voltage and phase current. In some aspects of the disclosure, the phase current in each phase may be up to 375A RMS. Each phase may be supplied to an electric machine via busbars (AC busbars), e.g., separate busbars.

Alternatively, the outputs of each pair of semiconductor switches may be connected in parallel such that a single output phase is connected to the electric machine via an AC busbar. Paralleling the pairs of semiconductor switches allows for an inverter with greater phase current capability. That is, in some aspects of the disclosure, the current flowing within the phase output when paralleled may be up to 1125A RMS for the single phase. Since the pairs of semiconductor switches are parallel connected and driven with synchronous gate-source drive voltages, the design allows for a shared balance of switching loss and conduction loss to the switches. If the gate-source voltages are not controlled synchronously, the sharing between the different pairs of semiconductor switches will not be equal. For example, the pair(s) of semiconductors switches receiving a higher portion of the total switching loss or conduction loss may be damaged due to a thermal overload or have a reduced life due to a higher imbalance in die temperatures during operation. This impacts the performance of the inverter (and inverter module) and reduces reliability.

Currently, the configuration and arrangement of the power supply unit/gate driver circuits is dependent upon the type of load being driven. Typically, the nature of a gate drive circuit card is that it is designed for a single application. That is, a first printed circuit wiring board (PWB) assembly configured with a gate driver and power supply unit circuit topology for loads requiring independent power transistor switching operations is manufactured for installation in a power conversion module, while for loads requiring parallel connected power transistor switching operations, a second separately manufactured PWB that is provided with a different gate driver and power rail supply unit circuit topology configuration is installed in a power conversion module.

SUMMARY

There is provided a single PWB card implementing one or more power supply unit/gate driver circuits topologies for two applications: 1) a gate drivers/power switching application configured with independently operable gate drive circuits; or 2) a gate drivers/power switching application configured as a parallel connected, current shared topology.

According to this aspect, a single PWB is alternately configurable as either a first power supply unit/gate driver circuit topology for use in independently controlled gate driving operations, or by merely populating or de-populating components on the circuit board, changing the configuration to a second power supply unit/gate driver circuit topology for use in parallel-connected gate driving operations.

According to this aspect, the single PWB card assembly is alternately configurable for implementing at least two and up to six separate power supply unit/gate driver circuits in a first circuit topology configuration having circuit board wiring connections for driving independent operating switching power transistors, e.g., for 3-phase power driving operations. By populating certain components on the PWB, the single PWB card assembly is alternately configured for implementing at least two and up to six separate power supply unit/gate driver circuits in a second circuit topology configuration having circuit board wiring connections for driving parallel-connected operating switching power transistors, e.g., for high voltage single-phase power driving operations.

In an aspect of the disclosure, there is provided a configurable printed wiring board (PWB) for a power switching transistor device gate drive system. The PWB comprises: a plurality of gate driver control and associated power supply units at predetermined locations thereon, a respective gate driver control and associated power supply unit combination operable for independently driving a corresponding switching power transistor device operatively connected therewith to provide power to a connected load, each respective gate driver control and associated power supply unit combination having associated circuit topology located on the PWB such that, in a first PWB configuration, each respective gate driver control and power supply unit combination is electrically high voltage isolated for independently driving a corresponding connected switching power transistor device; and multiple pairs of connection structures integrated within the PWB at predetermined locations of circuitry associated with each respective gate driver control and associated power supply unit combination, each connection structure of a respective pair accommodating physical installation of a terminal of a resistor device on the PWB, wherein a first pair of connection structures permits a populating of a resistor component to electrically connect a power rail conductor associated with a first power supply unit to a like power rail conductor associated with a second power supply unit, and a second pair of connection structures permits a populating of a resistor component to electrically connect a conductor carrying a gate driver signal of a first gate driver control circuit used to control a first switching power transistor to a like conductor associated with a second gate driver control circuit for carrying a gate drive signal for controlling switching operation of corresponding connected second switching power transistor; wherein each the first and second paired connection structures when populated with a respective resistor component configure a second PWB configuration comprising a parallel connection of the first switching power transistor device and second switching power transistor device to drive the load and permit the first and second power supply units to thereby share current for driving the parallel configured switching power transistor devices associated with each first and second power supply unit.

In an aspect of the disclosure, the populated resistor device comprises a resistor value of approximately 0 ohms.

Further, according to this aspect, the configurable printed wiring board includes power supply circuitry for a power rail conductor to provide a positive voltage for powering components used for driving the parallel connected switching power transistor devices in a conductive state. In this second PWB configuration, a resistor component is installed between a third pair of connection structures to electrically connect a further power rail conductor associated with the first power supply unit to a like further power rail conductor associated with the second power supply unit.

Further, according to this aspect, the configurable printed wiring board includes power supply circuitry for a power rail conductor to provide a negative voltage for powering components used for driving the parallel connected switching power devices in a non-conducting state.

In a further aspect, when in said second PWB configuration, only a single gate driver controller circuit generates control signals for use in controlling switching of each said parallel switching power transistor devices.

Embodiments of the invention will be described in more detail below, by way of illustrative and non-limiting examples, with reference to the accompanying drawings.

DETAILED DESCRIPTION

In accordance with aspects of the disclosure, a single PWB is provided with one or more power supply unit/gate driver circuits alternately configurable in either a first power supply unit/gate driver circuit topology for use in independent load driving operations, or a second power supply unit/gate driver circuit topology for use in parallel-connected load driving operations.

In an embodiment, by merely populating or de-populating components on the single circuit board, the first power supply unit/gate driver circuit topology for use in driving independent loads is changed to the second power supply unit/gate driver circuit topology for use in parallel-connected load driving operations.

In accordance with this aspect, the single PWB card assembly is alternately configurable for implementing at least two and up to six separate power supply unit/gate driver circuits in a first circuit topology configuration having circuit board wiring connections for driving independent operating switching power transistors, e.g., for 3-phase power driving operations. By populating/depopulating certain components on the PWB, the single PWB card assembly is alternately configured for implementing at least two and up to six separate power supply unit/gate driver circuits in a second circuit topology configuration having circuit board wiring connections for driving parallel-connected operating switching power transistors, e.g., for high voltage single-phase power driving operations.

The single PWB provided with one or more power supply unit/gate driver circuits that is alternately configurable with different populated/de-populated components for two different load driving operations, is incorporated in a power conversion module of a vehicle system. The vehicle system may be used in hybrid electric vehicle (HEV) or a battery electric vehicle (BEV). The vehicle may be a personal vehicle, such as a scooter, car, motorcycle and truck or a commercial vehicle such as a truck or bus, a maritime vehicle such as a boat or submarine or a military vehicle such as a tank, self-propelled artillery, or troop transport. The vehicle may also be an airplane, helicopter, UAV, and other powered air vehicles.

Figure 1:
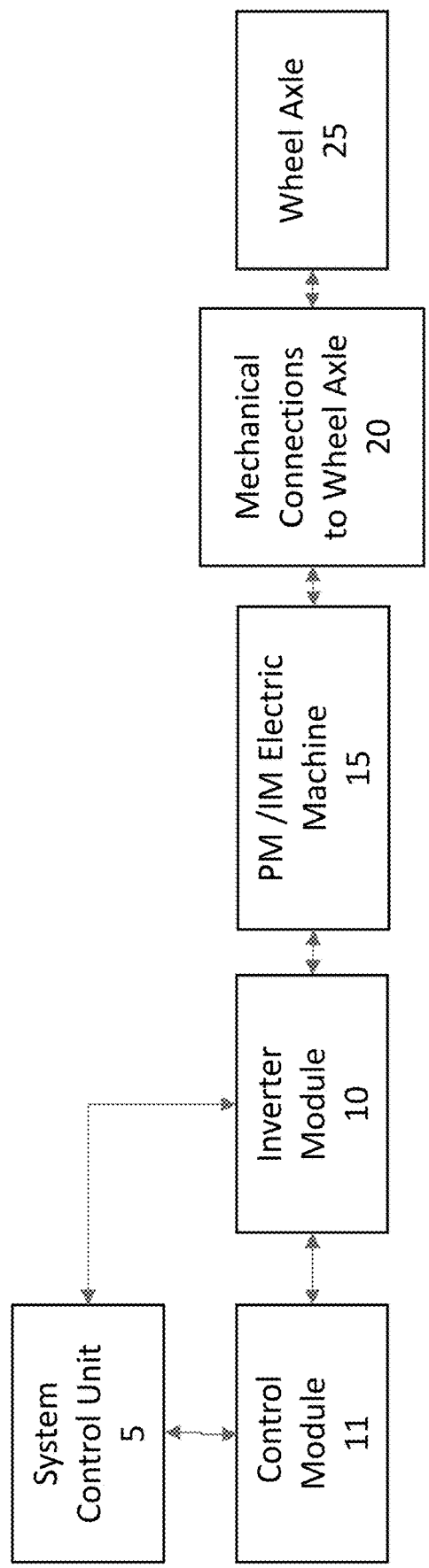
FIG. 1 illustrates an example of a vehicle system in accordance with aspects of the disclosure.

As shown in FIG. 1, the vehicle system may comprise a system control unit (SCU) 5, a control module 11, one or more inverter modules 10, one or more permanent magnetic (PM) or Induction electric machines (IM) 15, mechanical connections 20 and the wheel axles 25 (and wheels). In a case of airplanes, helicopters, UAVs and other powered air vehicles the PM/IM electric machine may be connected to a turbine (or other propulsion mechanism) and not a wheel axles.

In some aspects of the disclosure, the control module 11 and inverter modules 10 may be part of a modular power control system (MPCS). A MPCS is a modular line replaceable unit (LRU) containing a plurality of inverters modules and high voltage power distribution. The MPCS is scalable and customizable to have any number of inverter modules 10 and current interfaces. Different inverter modules may support and/or provide different phases of power. Each inverter module may have a wide bandgap switching unit having 3 or more phases of switching pairs. In some aspects of the disclosure, the wide bandgap switching unit 15 provide 3 phases. However, in other aspects, the wide bandgap switching unit 15 may provide 6 phases.

The control module 11 may control one or more inverter modules. In an aspect of the disclosure, the control module 11 may comprise one or more processors, memory and a communication interface. The communication interface may be control automation network CAN. The processor may be an FPGA. In other aspects of the disclosure, the processor may be a microcontroller or microprocessor or any other processing hardware such as a CPU or GPU. Memory may be separate from the processor (as or integrated in the same). For example, the microcontroller or microprocessor includes at least one data storage device, such as, but not limited to, RAM, ROM and persistent storage. In an aspect of the disclosure, the processor may be configured to execute one or more programs stored in a computer readable storage device. The computer readable storage device can be RAM, persistent storage or removable storage. A storage device is any piece of hardware that is capable of storing information, such as, for example without limitation, data, programs, instructions, program code, and/or other suitable information, either on a temporary basis and/or a permanent basis.

The communication interface may also be other network interfaces such as an ETHERNET, serial such as ARINC 429, 422, 485 interfaces or a wireless interface.

The MPCS may also comprise other modules not described herein.

The SCU 5 may also comprise a processor, memory and a communication interface. The SCU 5 communicates with the control module 11 and the inverter modules 10. The SCU 5 issues torque/speed commands to the control module 11 based on requests from an operator such as a driver of the vehicle via one or more inputs. The control module 11 receives these commands and generates corresponding control command for the respective inverter modules 10 and transfer the corresponding control commands to the inverter modules 10 such as via CAN.

The PM/IM electric machine(s) 15 may be surface permanent magnet electric machines, interior permanent magnet electric machines or induction electric machines.

The PM/IM electric machine 15 may be connected to the wheel axle(s) 25 (or turbine) via one or more mechanical connections 20. For example, the PM/IM electric machine 15 may be connected via a transmission, a drive shaft and a differential. The transmission may include a single or multiple gears. In other aspects of the disclosure, the PM/IM electric machine 15 may be included in an e-axle and the drive shaft may be omitted.

In some aspects of the disclosure, the inverter module(s) 10 and the PM/IM electric machine(s) 15 may be connected via cables. In other aspects of the disclosure, the PM/IM electric machine(s) 15 and the inverter module(s) may be integral.

Figure 2:
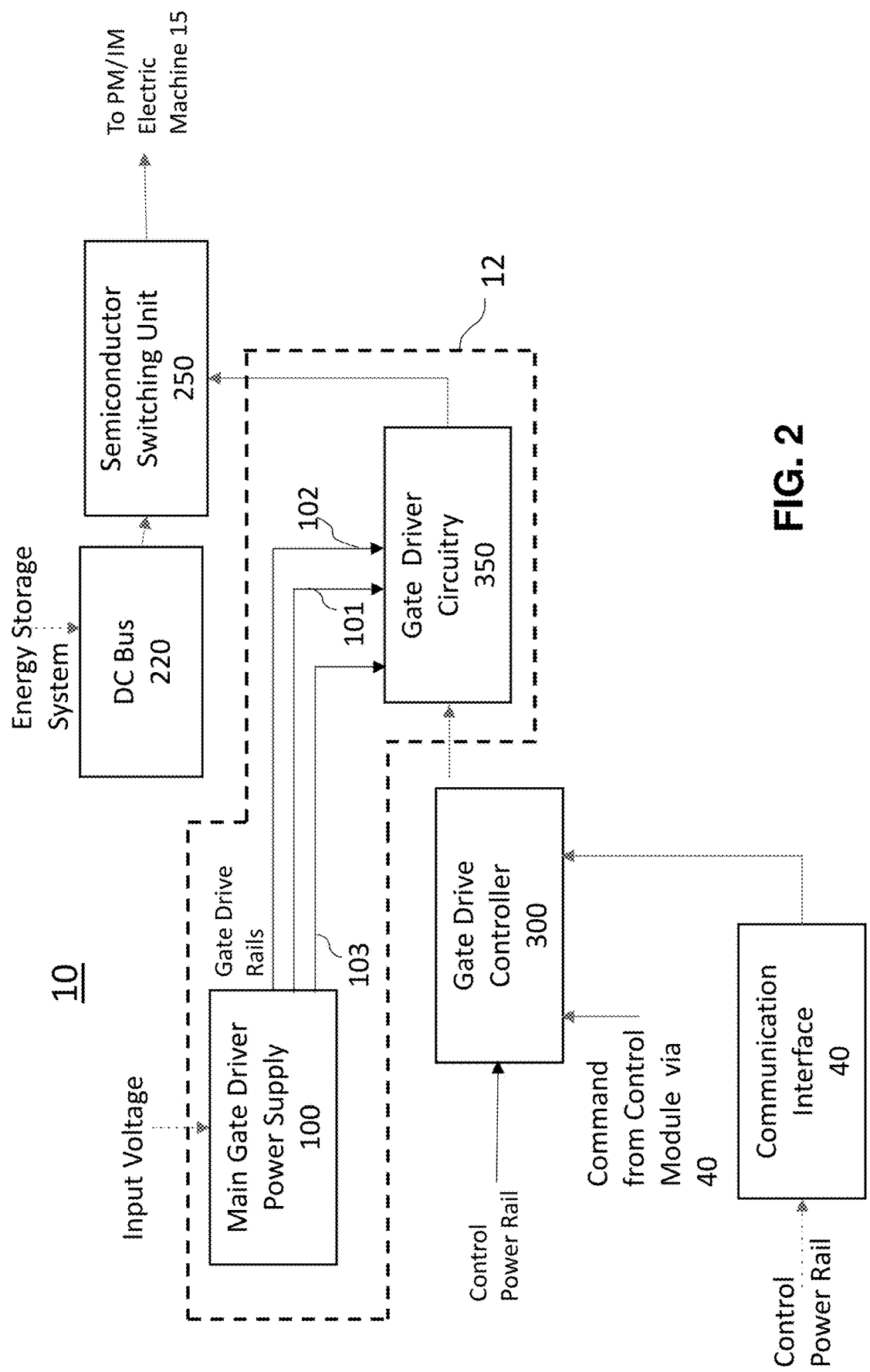
FIG. 2 illustrates an example of an inverter module including power supply and gate driver circuitry protected in accordance with aspects of the disclosure.
Figure 3:
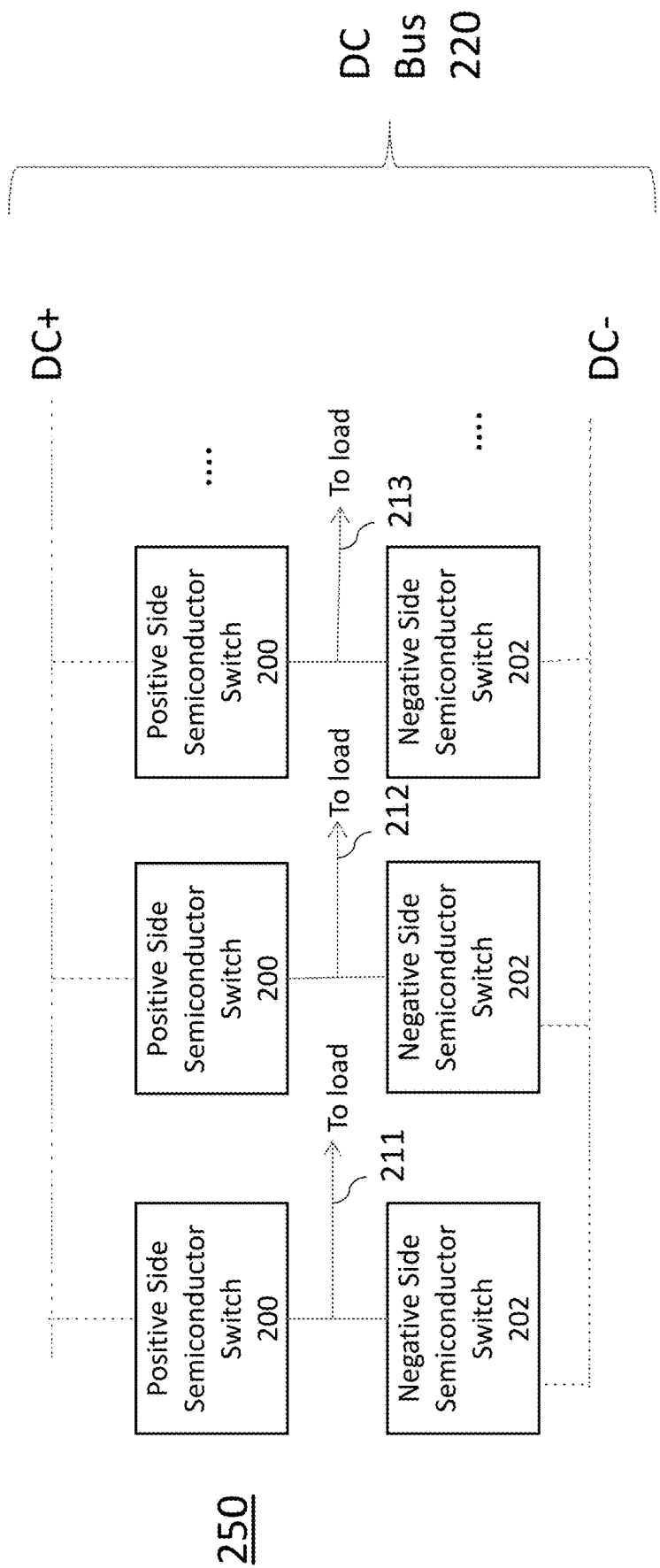
FIG. 3 illustrates an example semiconductor switching unit in accordance with aspects of the disclosure.

FIG. 2 illustrates an example of a portion of an inverter module 10 in accordance with aspects of the disclosure. The inverter module 10 may comprise a main gate driver power supply 100, a DC bus 220 that receives power from an energy storage system, e.g., a battery (not shown), a gate drive controller 300 (primary controller), gate driver circuitry 350, and a communication interface 40. The gate driver circuitry includes connections for eventual connection to a semiconductor switching unit 250 including an assembly of power transistors for driving the PM/IM electric machine 15. In an embodiment, a single PWB 12 (a single physical circuit board) includes the main gate driver power supply 100, and the gate driver circuitry 350, In an embodiment, the semiconductor switching unit 250 includes a plurality of pairs of semiconductor switches as illustrated in FIG. 3. Each pair of semiconductor switches 200, 202 is connected in a H bridge configuration between a positive DC rail and a negative DC rail of a DC bus 220. The pairs of semiconductor switches comprise a positive side semiconductor switch 200 (connected to the positive rail DC+) also referred to herein as HIGH and the negative side semiconductor switch 202 (connected to the negative rail DC−) also referred to herein as LOW.

The number of pairs of semiconductor switches 200, 202 depends on the number of phases supported by the inverter module 100. For example, for an inverter module 10 supporting a single phase 211, there may be a single pair of semiconductor switches 200, 202. However, for an inverter module 10 supporting three-phases 211, 212, 213, there may be three pairs of switches 200, 202. Supporting (of phases) as used herein is different than outputting to an electric machine such as the PM/IM electric machine 15 (where outputting is dependent upon the type of load being driven). Multiple phases may be independently output to an electric machine. In other aspects, the phases may be connected in parallel such that one output is supplied (one terminal).

The phases 211, 212, 213 from the wide bandgap switching unit 250 may be connected in parallel. For example, the three phases from 3 pairs of wide bandgap semiconductor switches may be connected in parallel to provide a single phase. The current (RMS) for the single phase may be set as needed per a specific application. In some aspects of the disclosure, the single phase may be connected to an electric machine such as a traction motor. In some aspects of the current may be up to about 1125A RMS (for the single phase).

In other aspects of the disclosure, the inverter module may provide three separate phases where the current in each phase may also be set as needed per the specific application. The three-phases may be used for an electric machine such as an integrated starter generator/motor (ISGM). In some aspects of the disclosure, the current in each phase may be up to 375A RMS.

The semiconductor switches 200, 202 may be transistors such as Insulated-gate bipolar transistors (IGBT) or field effect transistors (FETS). For example, the FETs may be wide bandgap semiconductor such as, but not limited to, silicon carbide (SiC) or gallium nitride (GaN). The switching frequency of the semiconductor switches 200, 202 may be application specific and designed to achieve a target power.

As further shown in FIG. 2, the main gate driver power supply unit 100 provides control power rail voltages for use by the gate driver circuitry 350 providing power transistor switching operations in the power inverter module 10.

In an embodiment, the main gate driver power supply 100 is seeded by a low voltage power (identified in the figures as "Input Voltage"), supplied either directly or indirectly via an external low voltage battery. The external low voltage battery may be a starting, lighting and ignition battery (SLI). In an embodiment, the control power rails include a voltage(s) for the gate drive controller 300, a voltage for the communication interface 40, etc. In some aspects of the disclosure, the SLI voltage may also be a control power rail.

The main gate driver power supply 100 on the single PWB provides a plurality of power rails for the gate driver circuitry 350 (gate drive rails). The connections to and within the plurality of main gate driver power supplies may be based on the number of pairs of semiconductor switches 200, 202 and the configurations thereof. For example, when there are three sets of pairs, such as three phases, e.g., u, v, w, the pairs may be separately driven and independent; alternatively, on the single PWB, the high side gate driver units may be connected in parallel for driving the positive (HIGH) side semiconductor switch 200 (connected to the positive rail DC+) while the corresponding low side gate driver units may be connected in parallel for driving the negative (LOW) side semiconductor switch 202 (connected to the negative rail DC−).

On the single PWB 12, when the three sets of pairs are separately driven, there may be six independent and separate main gate driver power supplies, e.g., one per separately driven semiconductor switch. In the alternate configuration, the single PWB is populated with components for such that, when the three sets of pairs are connected in parallel, there may be only two independent and separate supplies, three are connected together and share current (LOW and HIGH).

Figure 4:
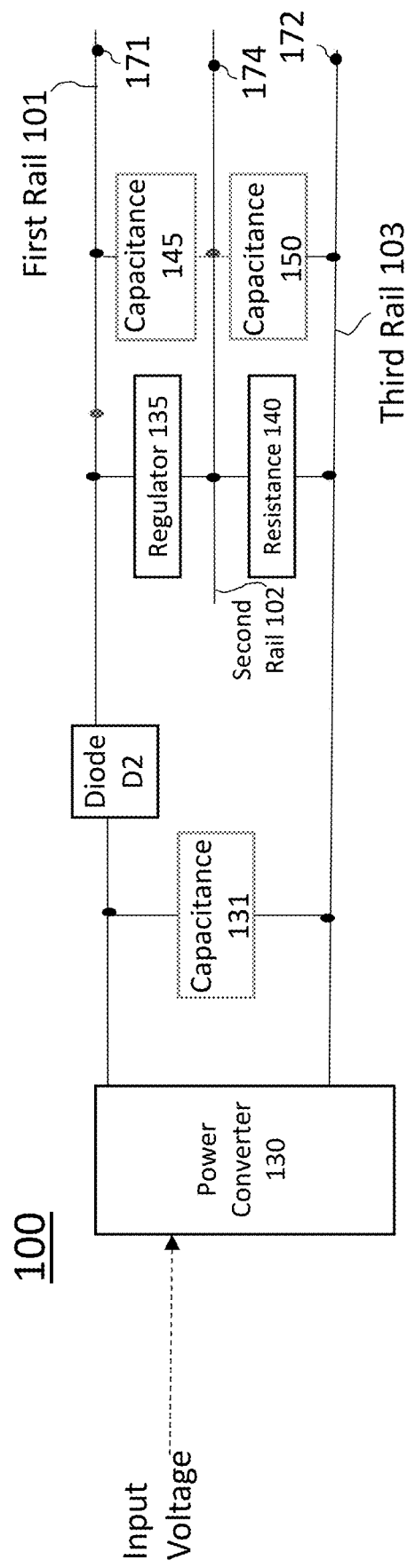
FIG. 4 illustrates an example block diagram depicting a main gate driver power supply unit for providing output power supply rail voltages in one aspect.

FIG. 4 illustrates an example of a main gate driver power supply 100 configured on the single PWB 12 in accordance with aspects of the disclosure.

The main gate driver power supply 100 is seeded by a low voltage (input voltage). This input voltage may be an SLI voltage or a voltage boost therefrom (Vboost). The input voltage is applied to a power converter 130. The power converter may be an open loop peak charge converter with post-regulation. In some aspects of the disclosure, the power converter 130 may comprise a transformer, rectifiers, filters, capacitance and a linear regulator operating to output a preset voltage that can be regulated to provide target gate drive rails (voltages). For example, the transformer may be a planar transformer having a single primary side coil and multiple secondary side coil Ms, where M is based on the number of pairs semiconductor switches as described above. For example, M may be 6 (three pairs). However, in other aspects, multiple different transformers may be used, one per, each separate and independent power supply.

The power converter 130 outputs a preset voltage V across capacitance 131. The preset voltage V may be further regulated to provide target gate drive rails such as using a regulator 135, resistance 140 and capacitance 145, 150. In an aspect of the disclosure, there may three rails The values of the specific rails: first rail 101, second rail 102 and third rail 103 are set by the voltage regulator 135 and resistance 140. The voltage regulator 135 may be a precision shunt regulator which is adjustable to customize the rails 101, 102, 103 (gate drive rails) as needed.

The specific values of the gate drive rails 101, 102, 103 may be based on the gate driver circuitry. In some aspects of the disclosure, the second rail 102 may provide a reference such that when the first rail 101 is referred to in the following description it is the voltage between the first rail 101 and the second rail 102 (difference) (HIGH) and when the third rail 103 is referred to in the following description is it the voltage between the third rail 103 and the second rail 102 (difference) (LOW). The separate rails 101, 102, 103 are maintained by capacitance 145, 150 such as capacitance 145 between the first rail 101 and the second rail 102 and capacitance 150 between the second rail 102 and the third rail 103. In some aspects of the disclosure, the first rail 101 and third rail 103 are set to hard drive the gates of the semiconductor switches 200, 202. In a parallel configuration supporting a single-phase power inverter driving operation the gate drive power provides two (one highside, one lowside) independent isolated, e.g., +15V/−5V power supply rails respectively, to support the paralleled (sharing switching losses, shared conduction losses) driving of the semiconductor switching (e.g., SiC MOSFET, GaN FET, IGBT).

As mentioned, the MPCS is scalable and customizable to have any number of inverters modules and current interfaces. Different inverter modules may provide different phases of power. Each inverter module may have a wide bandgap switching unit having 3 or more phases of switching pairs. In some aspects of the disclosure, the wide bandgap switching unit 250 provide 3 phases. However, in other aspects, the wide bandgap switching unit 250 may provide 6 phases.

The phases from the wide bandgap switching unit 250 may be connected in parallel. For example, the three phases from 3 pairs of wide bandgap semiconductor switches may be connected in parallel to provide a single phase. The current (RMS) for the single phase may be set as needed per a specific application. In some aspects of the disclosure, the single phase may be connected to an electric machine such as a traction motor. In some aspects of the current may be up to about 1125A RMS (for the single phase).

In other aspects of the disclosure, the inverter module may provide three separate phases where the current in each phase may also be set as needed per the specific application. The three-phases may be used for an electric machine such as an integrated starter generator/motor (ISGM). In some aspects of the disclosure, the current in each phase may be up to 375A RMS.

Figure 5A:
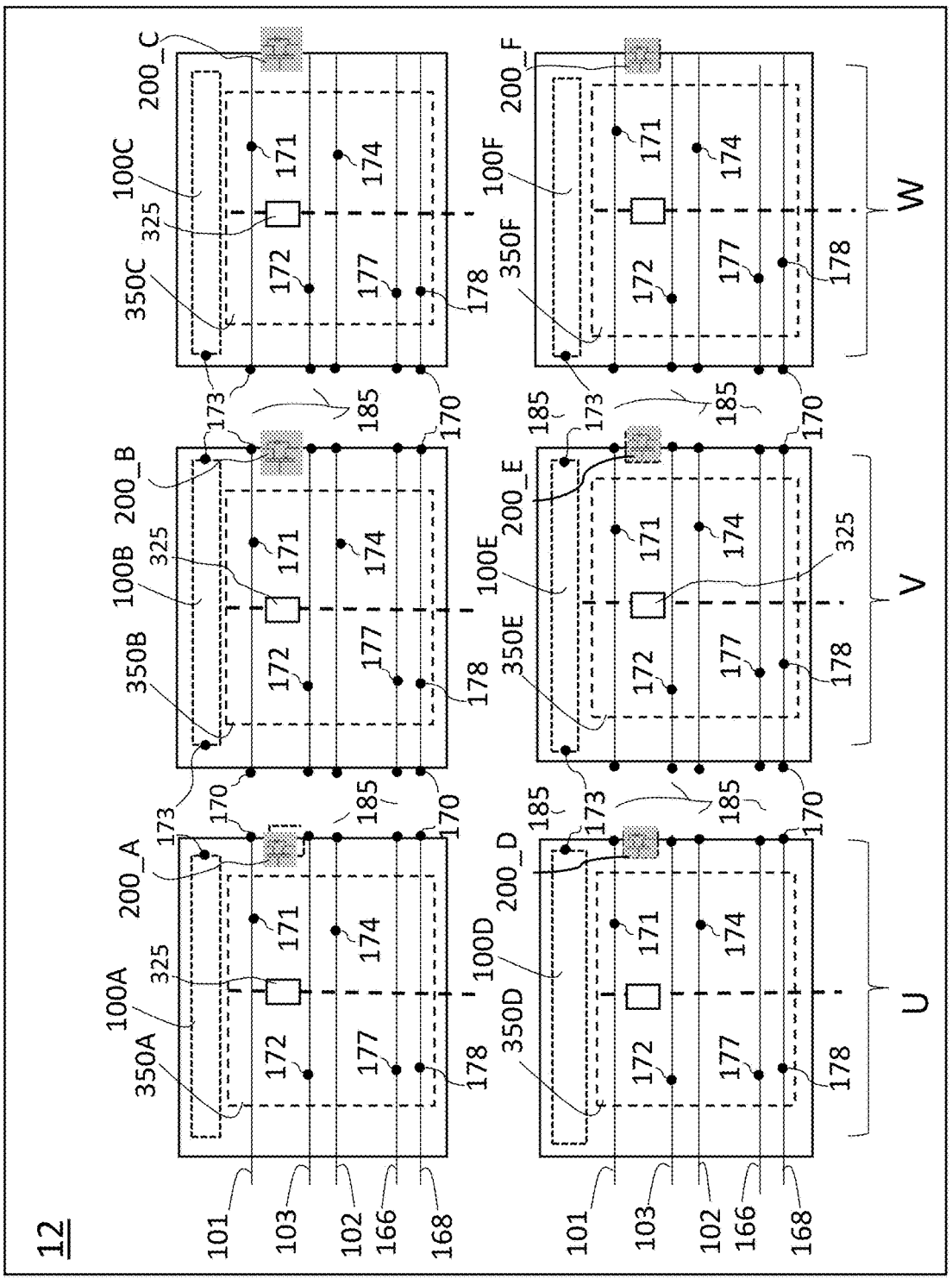
FIG. 5A conceptually depicts a single PWB configurable with a first gate drive circuit topology.
Figure 5B:
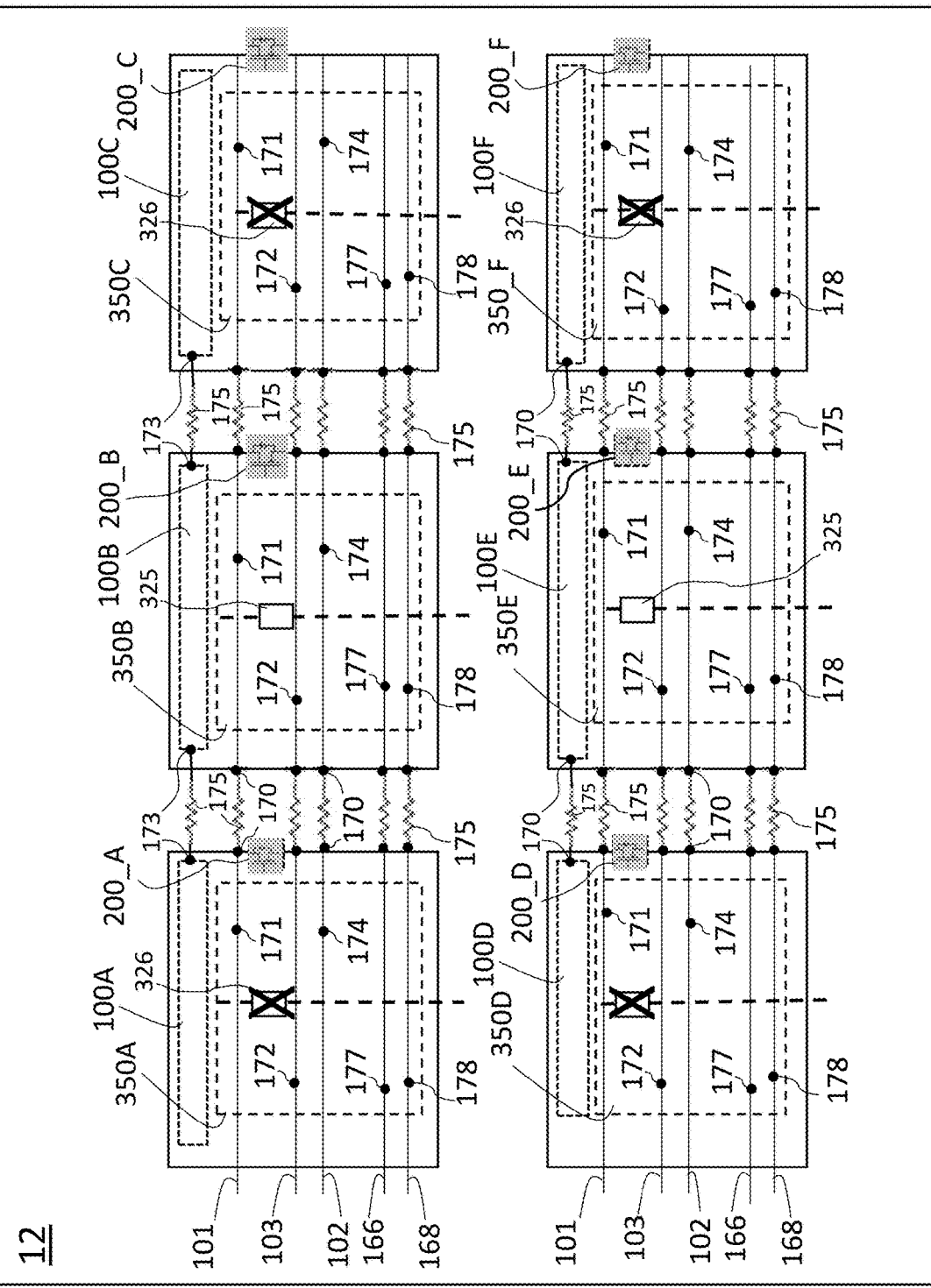
FIG. 5B conceptually depicts the single PWB of FIG. 5A configurable with a second gate drive circuit topology obtained by merely populating spanning resistor components and de-populating other components from the single PWB of FIG. 5A.

FIGS. 5A and 5B depict the single PWB card 12 configurable for implementing two gate driver applications. In a first application, the PWB card 12 is configured with a first power supply/gate driver circuit topology wherein at least two and up to six separate power supply unit/gate driver circuits are provided as shown in FIG. 5A. In this first application, printed circuit board wiring connections are provided for driving independent operating switching power transistors, e.g., for 3-phase power driving operations. In a second application, by populating/de-populating certain components on the PWB 12, the single PWB card assembly is alternately configured for implementing at least two and up to six separate power supply unit/gate driver circuits in a second circuit topology configuration shown in FIG. 5B having circuit board wiring connections for driving parallel-connected operating switching power transistors, e.g., for high voltage single-phase power driving operation.

For the first "independent" configuration, FIG. 5A represents a PWB 12 for a power inverter module 10 including six independently operable and isolated power supply units 100A, 100B, . . . , 100F for high voltage power distribution and low voltage power distribution in the MPCS. Each gate driver/power supply unit 100A, 100B, . . . , 100F unit is connected to and configured to drive a corresponding respective gate driver circuit 350A, 350B, . . . , 350F. Each power supply unit 100A, 100B, . . . , 100F includes a corresponding respective power transformer operating in an open loop peak charge converter configuration with a respective linear regulator (not shown) to provide power rails for operating a respective gate driver circuits 350A, 350B, . . . , 350F.

In the first "independent" topology configuration of FIG. 5A, the gate drive power supplies 100A, 100B, . . . , 100F provide six independently isolated and regulated +15/−5V power supply rails to support the driving of the semiconductor switches (e.g., SiC MOSFET, GaN FET, IGBT). The output power supply rails can also be easily adjustable in the hardware to vary the high side regulation between +12V and +20V and the low side regulation between 0V and −8V. The isolated regions of the PWB circuit card including the six main gate driver power supplies meet Underwriters Laboratories Inc. UL60950-1 creepage and clearance requirements for an example 800V system. For an example 800V system, this creepage is about 4 mm (spacing on the PCB 12) between nearest circuit components of each power supply unit 100A, 100B, . . . , 100F.

Further, in the first "independent" topology configuration of FIG. 5A, each respective gate driver circuit 350A, 350B, . . . , 350F is configured and controlled for driving a corresponding power switch transistor or power inverter 200A, 200B, . . . , 200F (e.g., a Silicon-Carbide SiC MOSFET or insulated-gate bipolar transistor (IGBT)) which is a wide bandgap semiconductor switch having high switching frequencies and transition rates, e.g., up to 100 kHz, to provide alternating current power to a load, e.g., machine, vehicle, etc. For non-limiting and illustrative purposes, the switching power transistor for driving a load will be referred to as a power MOSFET. Each semiconductor switch 200A, 200B, . . . , 200F may switch between a positive DC+ voltage and a negative DC−voltage under control of its corresponding isolated gate driver integrated circuit (IC) 325. In this configuration, the gate driver circuits 350A, 350B, . . . , 350F provide six independent isolated gate drive signals (+15V differentially Gate to Source for the power MOSFET to turn on, −5V differentially Gate to Source for the MOSFET to turn off) for six independent semiconductor switches (SiC, GaN, IGBT). These electrical components and the gate drive regions on the physical card need to be high voltage isolated from each other and meet the UL60950-1 creepage and clearance requirements, e.g., for an 800V system.

With more particularity, as shown in FIG. 5A, each gate driver circuit 350A, 350B, . . . , 350F can be powered by its own respective power supply unit 100A, 100B, . . . , 100F from a power source such as a battery. Each power supply unit 100A, 100B, . . . , 100F includes transformer circuitry for receiving power signals and processes the received signals through a rectifier circuit (not shown) and linear regulator that is configured to provide a positive rail supply (e.g., +15 V DC) and a negative rail supply (e.g., −5 V DC) voltage for powering components of a respective gate driver circuit.

In the independent configuration shown in FIG. 5A, the gate driver and power supply units are configured on the PWB to provide a 3-phase gate driver topology (3PG) or "little inverter" topology with each power supply unit having its own gate driver circuit operating independently to support driving its respective MOSFET power inverter. In this embodiment, a pairing of gate driver/power supply units provides alternating signals with a respective pair of gate drivers providing a respective phase, e.g., phase U, phase V, phase W. In one embodiment, the 3-phase power conversion module provides up to 375A RMS of current drive to a load. To support its own current drive, a respective power supply unit supplies its own independent power rails from a power source including a rectifier for generating both positive power supply rail (e.g., +15 V DC) and a negative power supply rail (e.g., −5.0 V DC) or ground for a high voltage section operation. In the general circuit depiction of FIG. 5A, six independent gate driver/power supply units can be configured as three pairs, each pair including a top gate driver circuit and a respective bottom gate driver, e.g., a pair 100A and 100D, a pair 100B and 100E, and a pair 100C and 100F. In the three-phase configuration, each pair 100A, 100D drives respective power switching transistors 200A, 200D, each pair 100B, 100E drives respective power switching transistors 200B, 200E, and each pair 100C, 100F drives respective power switching transistors 200C, 200F connected to a load. As shown in FIG. 5A, each respective top gate driver and respective bottom gate driver circuit pair is respectively operated and controlled to providing a respective U phase, V phase and W phase, of the 3-phase driving signal for driving a load. Thus, at each pair, for each U, V, W phase cycle, the respective top gate drive circuit and bottom gate driver circuit are controlled to operate synchronously where for part of a cycle the top or "Hi" gate driver is driven in the ON or conducting state (e.g., using the +15 V DC power supply rail voltage as the gate bias), while the corresponding bottom or "Lo" gate driver is driven in the OFF (non-conducting state) (e.g., using the −5 V DC power supply rail voltage as the gate bias), and in the remaining part of the cycle, under control of the respective top gate driver circuit logic and bottom gate driver circuit logic, the same Hi gate driver is driven in the OFF or non-conducting state (e.g., using the −5 V DC power supply rail voltage as the gate bias) while the corresponding Lo gate driver circuit is driven in the ON (conducting state) to drive each MOSFET switching transistor (e.g., using the +15 V DC power supply rail voltage as the gate bias). In the three-phase configuration, respective power supply units operate independently, each power supply regulator supporting its own power rail current drive when driving a three-phase load. For descriptive purposes, "v" may be a central power supply unit/gate driver circuit region while the "u" and "w" may be respective power supply unit/gate driver circuit outer regions, referring to the relative position of the circuit regions as illustrated in FIG. 5A.

As shown in the PWB 12 of FIG. 5A, throughout the circuitry, there are provided connector mounting structures or solder pads, e.g., solder structures or pads 170, 171, 172, 173, 174, 177, 178, dimensioned to facilitate pick and place mounting and soldering of a wire end or wire lead of a circuit component, e.g., a spanning resistor, for use in electrically connecting various circuitry. As shown in FIG. 5A, pairs 170 of square-shaped connector structures or solder pads are dimensioned to enable populating, i.e., mounting and soldering, of a respective circuit component, e.g., a spanning resistor. FIG. 5A shows multiple pairs of connector pads 170 that are "de-populated" without any spanning resistor components thereby rendering the single PWB in the independent configuration having isolated power supply/gate driver circuit units. In an embodiment, during PWB manufacture, a pick and place surface mount machine responsible for populating components on the PWB is positively instructed to avoid populating the certain regions with a spanning resistor component. FIG. 5A shows the absence of a spanning resistor component as an unpopulated spanning resistor tie region or an open circuit connection 185.

Figure 6A:
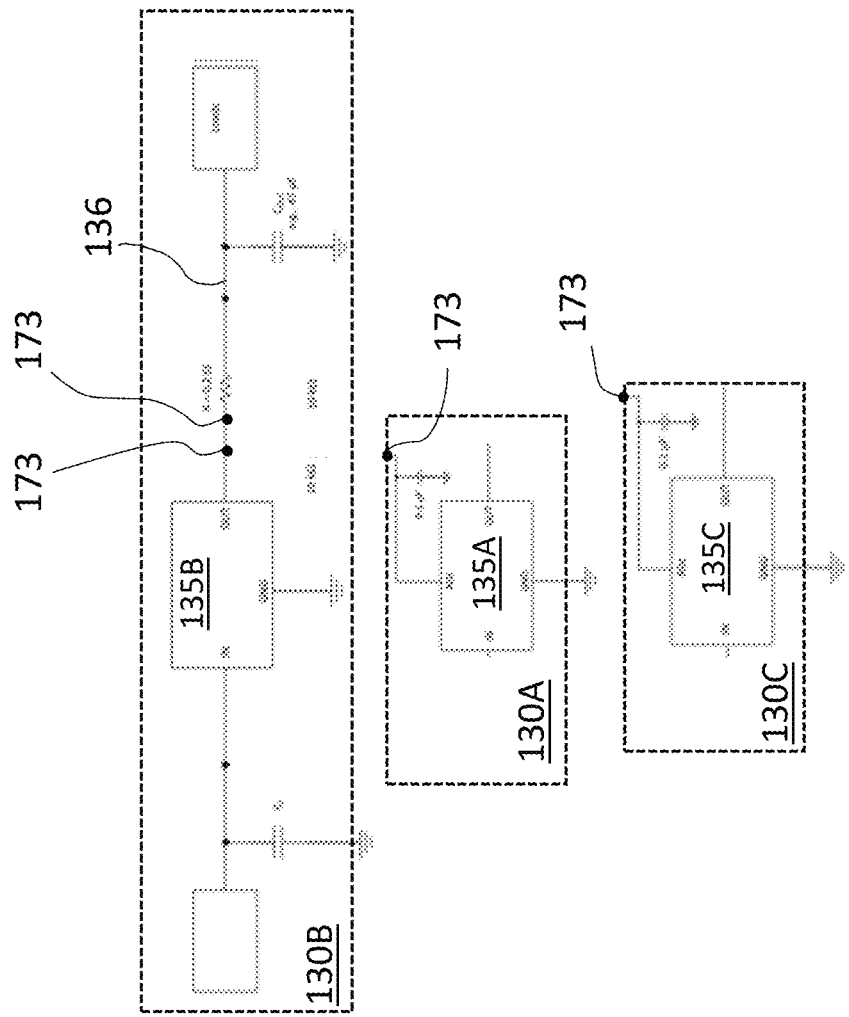
FIG. 6A conceptually depicts a portion of a single PWB including three main gate driver power supply unit linear regulator circuits for providing independent gate driver circuit power rails when configured for an independent gate driving application.

FIG. 6A shows a simplified block diagram of a portion of the PWB 12 including main gate driver power supply and linear regulator modules for providing the power rail voltages for the independent topology configuration shown in FIG. 5A. In particular, three independent power supply unit modules 130A, 130B, 130C are shown for respective power signal phases U, V, W and each have components and respective traces on the PWB that are physically separated in compliance with the primary UL UL60950-1 (e.g., standard for creepage and clearance) for high voltage components, e.g., a maximum voltage of 800 V. Thus, any two high voltage signal carrying conductors on the PWB circuit card 12 is spaced apart by no less than about 4 mm. The provided three power supply unit modules 130A, 130B, 130C each depict the respective linear regulator modules 135A, 135B, 135C. In this embodiment, the three (3) linear regulators 130A, 130B, 130C for the respective highside main gate drive power supply units are (and similarly, three linear regulators for low side main gate drive power supply units) are independently operated to provide respective six independent power rails (not shown) used to power respective gate driver circuitry for switching respective power MOSFET devices. As shown, the structure includes pairs of solder structures or pads 173 for accommodating one or more series-connected nominally 0 ohm spanning resistors which are populated when configuring the PWB 12 for the second parallel-connected configuration of FIG. 5B. That is, in FIG. 6A, an output of a first linear regulator 135B, functioning as a "master" linear regulator (e.g., corresponding to power supply unit for phase V), includes a first solder pad 173 that can connect a power rail setting output line 136 to a like solder pad 173 at a power rail setting input of "slave" linear regulator 135A (e.g., corresponding to power supply unit for phase U) using a spanning resistor, and likewise includes a second solder pad 173 that can connect the power rail setting output line 136 using a spanning resistor to a like solder pad 173 at a power rail setting input of another "slave" linear regulator 135C (e.g., corresponding to power supply unit for phase W) when configured in parallel to support a load requiring a single phase.

As shown in FIG. 5B, using the same printed circuit wiring board 12, an alternate "parallel" configuration is obtained by merely specifying, in the PWB production, a further population/de-population of various circuit components and devices. The alternate parallel configuration of FIG. 5B particularly provides a population of one or more series-connected zero ohms (0.0 Ohms) spanning resistor devices 175 to short various system components together to configure a single phase driver topology (1PG) or "big inverter" topology with each power supply unit 100A, 100B, 100C being configured in parallel and units 100D, 100E, 100F being configured in parallel to share in driving the load at a single phase (and at a greater current). Consequently, in this 1PG mode, the gate drivers (inverters) cannot be driven by independent power rail voltages, but each must have a common power rail, e.g., both +15 V DC and −5.0 V DC to use at each gate drive location. In the general circuit depiction of FIG. 5B, the top three gate drivers are driven by a single isolated gate driver IC 325 and operated such that where for part of a cycle those top Hi gate drivers are driven in the ON or conducting state by being switched at the same time (e.g., using the +15 V DC power supply rail voltage as the gate bias) while the corresponding bottom Lo gate drivers are driven in the OFF (non-conducting state) (e.g., using the −5 V DC power supply rail voltage as the gate bias). In a remaining part of the cycle, under control of the gate driver logic, top Hi gate drivers are driven in the OFF or non-conducting state while the corresponding bottom LO gate drivers are switched at the same time and driven in the ON (conducting state).

In this second "parallel" topology configuration of FIG. 5B, the gate drive power supply functions as two (one highside, one lowside) independent isolated +15V/−5V power supply rails to support the paralleled (sharing switching losses, shared conduction losses) driving of the semiconductor switching (e.g., SiC MOSFET, GaN FET, IGBT). The output power supply rails are additionally adjustable in the hardware to vary the high side regulation between +12V and +20V and the low side regulation between 0V and −8V. In this alternative configuration, the regions that were once isolated in the configuration of FIG. 5A, now include portions that are shorted together to promote the power supply paralleled configuration. As shown in the PWB of FIG. 5B, and absent from the independent configuration of FIG. 5A, there are provided one or more series-connected spanning resistor components 175 (e.g., each nominally at 0.0 ohms) at the pairs of connectors or pads 170, 173. Each spanning resistor component 175 at a pair of solder pads 170 connect or short together, in the power supply and gate driver circuitry, the various circuit components for the paralleled configuration. To populate these regions, an itemized list or bill of materials will specify the particular resistors (using reference designators and/or part numbers) to be populated and their locations such that a pick and place surface mount machine can automatically select and place the exact resistor at the exact location on the circuit card so that a re-solder flow process can effectively solder the exact specified spanning resistor component in place on the PWB at the exact location.

The populating of the spanning resistor components 175 shown in FIG. 5B enable a connection of the power supply paths through the transformer and post regulating linear regulators to share the load currents so one path does not get overloaded/overstressed/overheated.

Figure 6B:
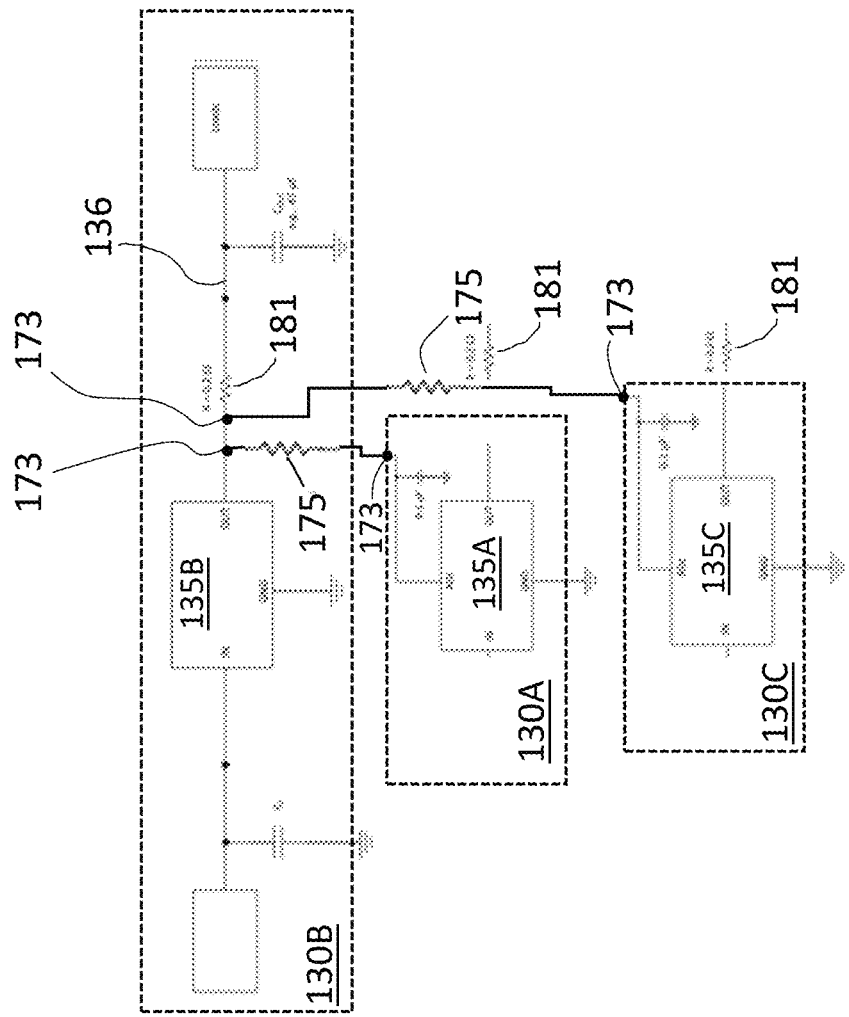
FIG. 6B conceptually depicts a portion of a single PWB including the three main gate driver power supply unit linear regulator circuits and connecting spanning resistors for providing current sharing gate driver circuit power rails when configured for a parallel connected gate driving application.

FIG. 6B shows a simplified block diagram of the portion of the PWB 12 including main gate driver power supply and linear regulator modules for providing the power rail voltages for the parallel topology configuration shown in FIG. 5B. In particular, the three independent power supply unit modules 130A, 130B, 130C (for respective power signal phases U, V, W) include respective linear regulator modules 135A, 135B, 135C for the respective highside main gate drive power supply units provide parallel connected respective power rail voltages (not shown) used to power gate driver circuitry for switching parallel connected MOSFET devices. As shown, the structure includes pairs of solder structures or pads 173, each pair of solder pads for accommodating one or more series-connected spanning resistors 175 which are populated when configuring the PWB for the second parallel-connected configuration of FIG. 5B. That is, in FIG. 6B, an output of a first linear regulator 135B, functioning as a "master" linear regulator 135B (e.g., corresponding to power supply unit for phase V), includes a first solder pad 173 that connects a power rail setting output line 136 to a like solder pad 173 at a power rail setting input of "slave" linear regulator 135A (e.g., corresponding to power supply unit for phase U) using a first spanning resistor 175. Likewise, a second solder pad 173 connects the power rail setting output line 136 using a second spanning resistor 175 to a like solder pad 173 at a power rail setting input of another "slave" linear regulator 135C (e.g., corresponding to power supply unit for phase W) when parallel configured to support a load requiring a single phase. First and second spanning resistors 175 can each include a series connection of up to three resistors so that the cumulative sum of the gaps between each resistor when depopulated spans a distance meeting the minimum creepage distance requirement. Thus, FIG. 6B depicts the topology of the power supply circuit 100 allowing the master regulator to set the nominal regulation based on feedback resistors (not shown) to provide a reference that is followed by the other connected slave regulators because of circuit connections that enable current sharing within a tight tolerance. In this embodiment, the three linear regulators (135A, 135B, 135C and similarly, 135D, 135E, 135F) are respectively paralleled to regulate tightly (e.g., within +/−4 mV) in terms of voltage so that the currents can be shared. That is, the interconnection of the linear regulator 135B to both regulators 135A, 135C is performed in parallel such that a connection permitting current sharing for a one phase configuration enables each other linear regulator to regulate to within a few millivolts (e.g., +/−4 mv) of each other. Thus, either each power supply 100A, 100B, 100C (and similarly 100D, 100E, 100F) independently operates to support the 3-phase operations and are high voltage isolated from each other, or three power supplies outputs are tied together to share the load equally for the single-phase operation configuration.

In addition to the tight regulation between the three paralleled regulators, an output droop feature in the form of output series resistor 181 is providing a negative feedback for current sharing.

Further, in the "parallel" configuration, as shown in FIG. 5B, using the same printed circuit wiring board 12, a further population/de-population of various circuit components and devices provide the three independent high side gate driver circuits 350A, 350B, 350C (and likewise low side gate driver circuits 350D, 350E, 350F) to now function as a single gate driver, e.g., for the single-phase driving operation. In this embodiment, the rising and falling voltages on the gates of the switching power MOSFETs 200, 202 track each other so that the turn on and turn off thresholds on the paralleled devices are hit at the same moment in time. This allows the dynamic switching losses of semiconductor devices to share equally and allow equal heating/power stress to the devices. The conduction losses on the devices will also share as there is a negative feedback mechanism for this sharing built into the MOSFET (i.e., Rds_on rises when hotter due to positive temperature coefficient, so it forces more current into the less conducting path to equalize current flow).

Referring back to FIGS. 5A, 5B, in an embodiment, to allow a single Printed Wiring Board design that is configurable for either of two applications, specific tie locations 170 are provided on the PWB 10, and depending on the configuration, the tied locations 170 are either connected by a 0 ohms spanning resistor 175 as shown in FIG. 5B, or are not connected by a spanning resistor as shown by open circuit connections 185 in FIG. 5A. The present or absence of the spanning resistor 175 enables the gate drive and gate drive power supply topology to allow for a single Printed Wiring Board design that is configurable to drive a six-pack Silicon Carbide MOSFET Module as either: 1) a Half Bridge Function with the three high side switches get paralleled and three low side switches get paralleled to allow sharing of switching and conduction loss as shown in FIG. 5B; or 2) as a three phase inverter function where the six independent gate drivers and gate driver Power Supplies are configured to maintain High Voltage creepage separation as shown in FIG. 5A. Thus, as shown in FIG. 5A, power rail lines at each independent gate drive circuit 350A, 350B, . . . , 350F are not parallel connected and are isolated by gaps 185 in the PWB 12.

As shown in FIG. 5B, for the single phase configuration in which 3 phases are driven as a single switch, only a single isolated gate driver IC 325 is operated for the high side switching MOSFET 200B. The other gate driver circuits 350A, 350C have the isolated gate driver ICs de-populated as shown as removed components 326. This single gate driver controller 300 is used for controlling each of the other shared gate driver circuits, e.g., 350A, 350C for current sharing. In this configuration, the PCB 12 layout topology includes populated spanning resistors 175 that are provided to connect the +15V isolated (HV referenced) power rail conductor trace 101, −5V isolated (High Voltage referenced) rail conductor trace 102, a ground (GND) isolated (HV referenced) conductor trace 103 and two gate drive signal conductor lines 166 and 168 from the operating gate drive circuit 350B to corresponding solder pad locations at each of the other gate drive circuits 350A, 350C.

Likewise, for the single phase PWB configuration in FIG. 5B in which 3 phases are driven as a single switch, for the low side switching MOSFETs, only a single isolated gate driver IC 325 is operated for the low side switching MOSFET 200E. This single gate driver circuit 350E is used for controlling each of the other shared gate driver circuits, e.g., 350D, 350F for current sharing. In this configuration, the PCB 12 layout topology also includes the population of spanning resistors 175 that are provided to connect the like +15V isolated (HV referenced) power rail conductor 101, −5V isolated (HV referenced) rail conductor 102, a ground (GND) isolated (HV referenced) conductor 103 and two gate drive signal conductor lines 166 and 168 from the operating gate drive circuit 350E to corresponding solder pad locations at each of the other gate drive circuits 350D, 350F.

In the embodiment of FIGS. 5A, 5B, and as shown in further detail in FIG. 4, each high side gate driver circuit 350A, 350B, 350C includes a solder pad connection 171 spaced apart and paired to a like solder pad connection 171 at the +15V Isolated (HV Referenced) power rail trace 101 for high side switching MOSFET operation. The +15V Isolated (HV Referenced) power rail 101 is a power rail trace provided on the PCB 12 interrupted only by the connections 170 which are either connected by spanning resistors as shown in FIG. 5B or are open circuit as shown in FIG. 5A. Similarly, each lower gate driver circuit 350D, 350E, 350F includes a connection 171 to the +15V Isolated (HV referenced) power rail trace conductor 101 for low side switching MOSFET operation. In this embodiment, the PCB 12 includes individual controlled power rail trace conductors 101 that can connect with each other via spanning resistors 175 to provide a common power rail connection for sharing current when operating in single phase.

As shown in FIGS. 5A, 5B, and as shown in further detail in FIG. 4, each high side gate driver circuit 350A, 350B, 350C includes a further solder pad connection 172 that is spaced apart and paired to a like solder pad connection 172 to the −5V Isolated (HV Referenced) Rail trace conductor 103 for high side switching MOSFET operation. The −5V Isolated (HV Referenced) Rail trace conductor 103 is a power rail trace provided on the PCB interrupted only by the connections 170 which are either connected by spanning resistors as shown in FIG. 5B or open circuit as shown in FIG. 5A. Similarly, each lower gate driver circuit 350D, 350E, 350F includes a connection 172 to the −5V Isolated (HV Referenced) power rail trace conductor 103 for low side switching MOSFET operation. In this embodiment, the PCB 12 includes individual controlled power rail trace conductors 103 that can connect with each other via spanning resistors 175 to provide a common power rail connection for sharing current when operating in single phase.

Further, as shown in FIGS. 5A, 5B, and further in detail in FIG. 4, each upper gate driver circuit 350A, 350B, 350C includes a further connection 174 that is spaced apart and paired to a like solder pad connection 174 to the ground (GND) Isolated (HV Referenced) trace conductor 102 for the high side switching MOSFET operation. The GND Isolated (HV Referenced) conductor trace 102 is a power rail trace provided on the PCB 12 interrupted only by the connections 170 which are either connected by spanning resistors as shown in FIG. 5B or open circuit as shown in FIG. 5A. Similarly, each lower gate driver circuit 350D, 350E, 350F includes a connection 174 to the GND Isolated (HV Referenced) conductor trace 102 for low side switching MOSFET operation. In this embodiment, the PCB 12 includes individual controlled power rail trace conductors 102 that can connect with each other via spanning resistors 175 to provide a common power rail connection for sharing current when operating in single phase.

Figure 7:
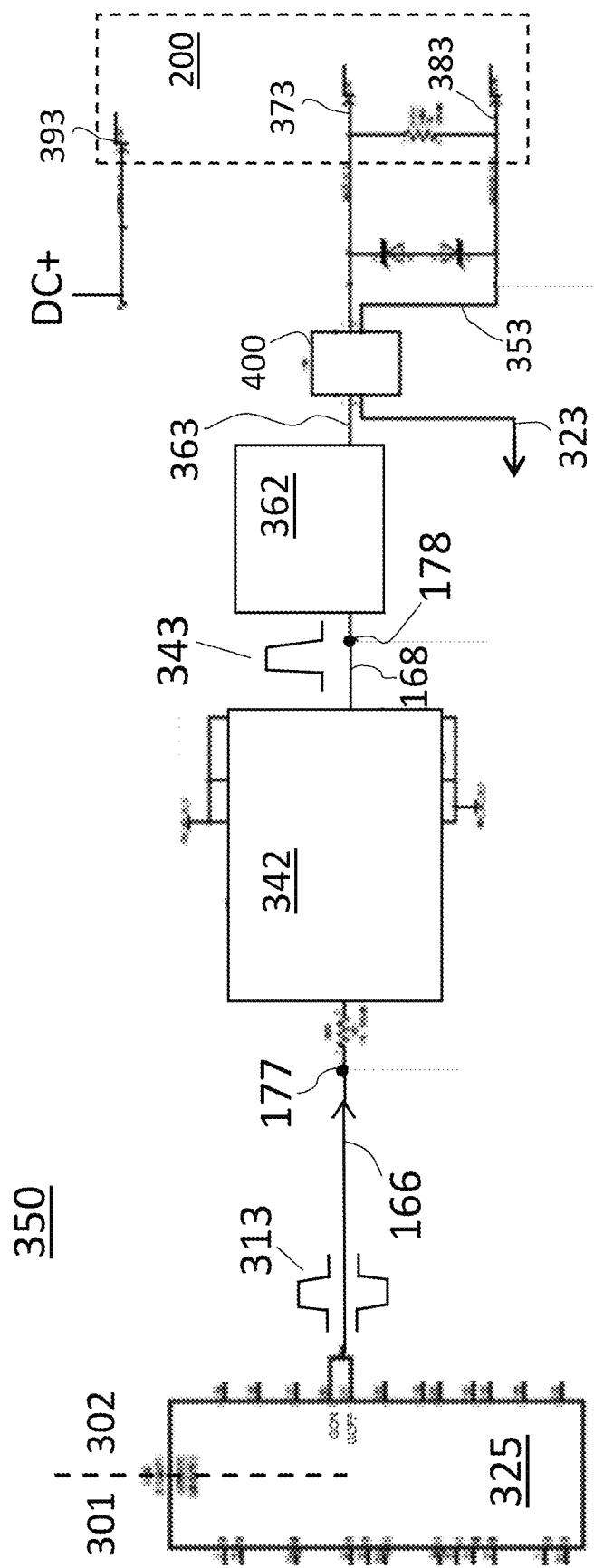
FIG. 7 illustrates a simplified circuit diagram of the gate drive circuitry.

FIG. 7 illustrates a more detailed depiction of the gate drive circuit 350 of each power supply unit of modular power conversion module and is representative of a portion of each of the high side (350A, 350B, 350C) and low side (350D, 350E, 350F). As shown, the gate drive circuitry 350 includes the isolated gate driver IC 325 (e.g., an STGAP1AS available from STMicroelectronics) providing the logic and signals for driving the power inverter (e.g., MOSFET) 200. The isolated gate driver integrated circuit 325 integrates a low voltage section 301 and additionally integrates a high voltage section 302 with circuitry for switching the power inverter MOSFET 200.

The low voltage section 301 includes pin connections for inputting/outputting signals that include various logic input signals including the receiving of a gate command (driver input) signal, a clock signal, serial data I/O. For the high voltage section 302, the isolated gate drive IC 325 includes pin connections for inputting/outputting signals for controlling power MOSFET gate drive operations including an output GON/GOFF analog Gate source output signal 313 for respectively turning on/off gate source of power inverter MOSFET 200. The GON/GOFF analog Gate source output signal 313 is carried on conductor 166 for input to a localized current boost circuitry including parallel connected booster circuit 342 that receives either the GON/GOFF analog Gate source output drive signal 313 and boosts its current for respectively driving on/off the gate source of a connected power inverter 200. In the current boost portion, each one (or more) parallel connected current booster circuits 342 includes a complementary paired connection of current boosting transistors (not shown) for boosting the GON/GOFF analog Gate source output signal 313 to provide a current boosted analog gate source drive signal 343 at the output conductor 168 of the boosting transistors.

FIG. 7 further depicts a slew control circuit 362 that includes a resistor network receiving the current boosted analog gate source drive signal 343 carried on the conductor 168 for controlling the gate drive signal slew rate, i.e., the rate at which the gate of the MOSFET switching inverter 200 is driven (turned on/off) with the resistors being of values tailored to finding a balance between low switching losses and reducing EMI (electromagnetic interference). The output conductor 363 of the slew rate control circuit 362 is connected to one end of an inductor (wire coil) of a multi-wire common mode choke 400 that includes a second end connected to the gate terminal 373 of the MOSFET switching inverter 200. The multi-wire common mode choke 400 presents a low impedance connection for the current boosted switching power MOSFET gate drive input to the gate terminal 373 of the MOSFET switching inverter 200 and presents a high impedance for reducing circulating current loops and common mode high voltage transient signals generated as a result of MOSFET switching operations of the switching power MOSFET 200, e.g., when in parallel (current shared) operation.

As further shown in FIG. 7, there is connected to the source terminal 383 of the MOSFET switching inverter 200 a conductor 353 that functions as a source/emitter return path for gate drive loop currents and a sense signal return line for the source voltage provided for overcurrent protection. Conductor 353 also functions as a local gate driver ground reference. This source/emitter return path for gate drive currents/sense signal line/local gate driver ground reference line 353 is connected to a second wire of the multi-wire common mode choke 400. At the other end 323 of the second wire of the multi-wire choke, the sensed signal is connected to and filtered by a further resistor net (not shown) and ultimately received at a sense signal input to the isolated gate driver IC 325. A further drain terminal 393 of the MOSFET switching inverter 200 connects the high voltage positive DC+ bus and includes additional electrical connections to a Desaturation overload protection path (not shown).

Returning back to FIGS. 5A, 5B, each upper gate driver circuit 350A, 350B, 350C (and represented as gate diver circuit 350 shown in FIG. 7) includes further respective solder pad connections 177, 178 at the respective Gate Drive Signal conductor lines 166 and 168 for the high side switching MOSFET operation. The Gate Drive Signal conductor line 166 provides a solder connection pad 177 at the input of the localized booster circuit provided on the PCB 12 for receiving the isolated gate driver IC GON/GOFF signal. The Gate Drive Signal conductor line 168 provides a solder connection pad 178 at the output of the localized booster circuit provided on the PCB 12. Each of these respective Gate Drive Signal conductor lines 166 and 168 are interrupted only by the connections 170 which are either connected by spanning resistors as shown in FIG. 5B for single phase operation or are open circuited 185 as shown in FIG. 5A for three phase operation. Similarly, each lower gate driver circuit 350D, 350E, 350F includes the further respective connections 177, 178 to the respective Gate Drive Signal conductor lines 166 and 168 for the low side switching MOSFET operation. The Gate Drive Signal conductor line 166 provides connections 177 to the localized booster circuit provided on the PCB 12 for receiving the gate driver IC GON/GOFF signal. The Gate Drive Signal conductor line 168 provides connections 178 to the output of the localized booster circuit provided on the PCB 12. Each of these respective Gate Drive Signal conductor lines 166 and 168 are interrupted only by the connections 170 which are either connected by spanning resistors as shown in FIG. 5B for single phase operation or are open circuited 185 as shown in FIG. 5A for three phase operation. Thus, for single phase, parallel connected current sharing operations, the populated resistors 175 at connections 170 enable the single isolate gate driver IC 325 to provide the same analog gate source drive signal 313 and current boosted analog gate source drive signal 343 to each of the parallel connected MOSFETs.

Figure 8:
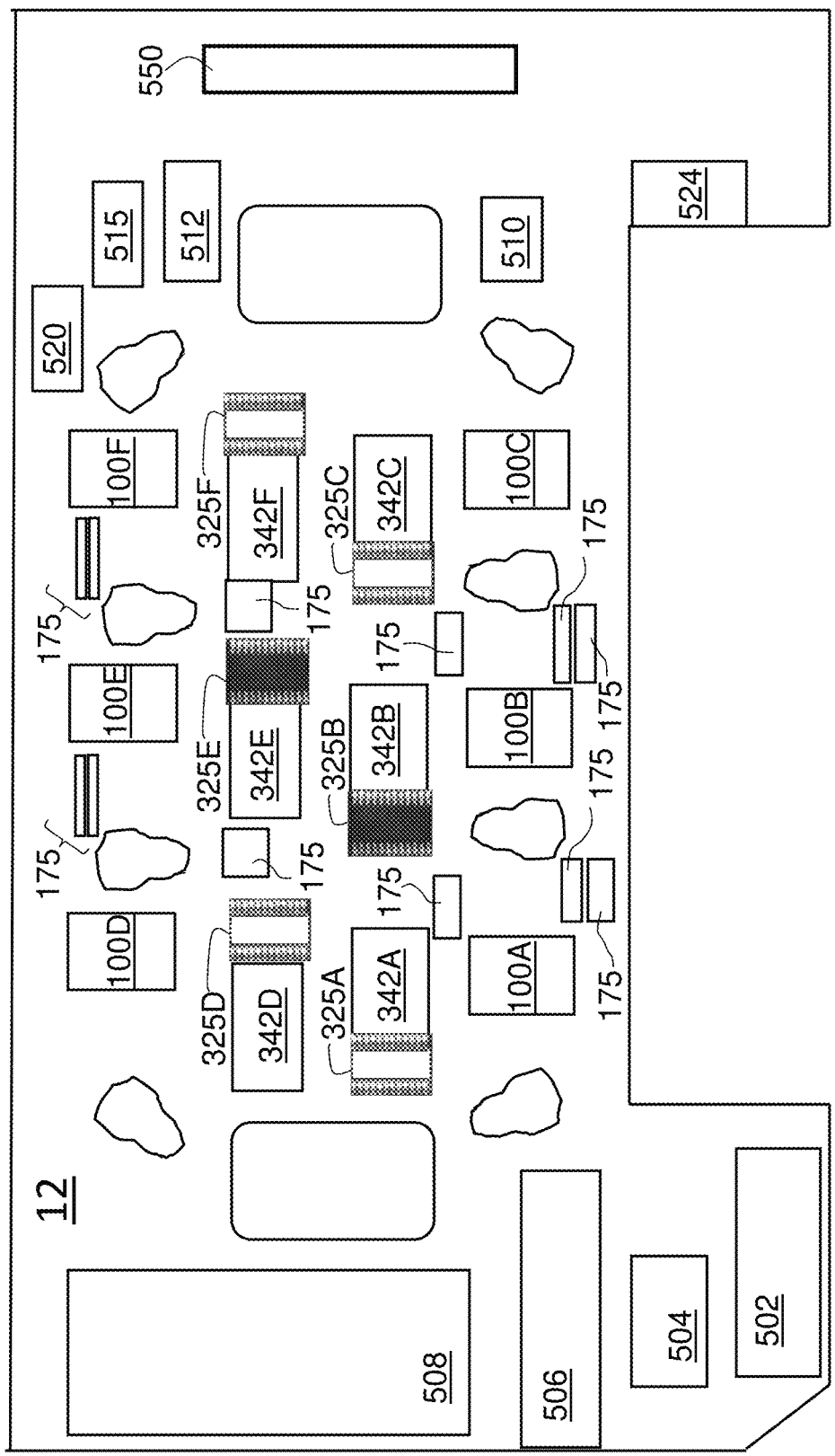
FIG. 8 depicts a PWB layout of the components configurable for enabling two applications: 1) a first topology for independent gate driver power switching operation or 2) in a second topology for driving parallel-connected power transistor switches.

FIG. 8 depicts a physical layout of the major components/regions of the main gate driver power supply and gate driver circuitry for the power inverter module. As shown in FIG. 8, the physical layout of each independently operated gate drive circuit 350A, . . . , 350F and power supply unit on the PWB 12 maintains a symmetry so that when configured in a parallel (current-shared) topology, and when they are controlled by a single upstream isolated gate driver IC 325 (e.g., STGAP1AS), the dynamical behavior of the switching MOSFETs can be aligned in time. Thus, as shown in FIG. 8, the interconnected components and spanning resistor locations are symmetrically situated on the PCB 12 to minimize the area of any high current loops, minimize noise, match input/output impedances. Further, ground references are strategically placed to control current return paths.

The layout of the PCB 12 of FIG. 8 is such that there are six isolated regions for 3 phase drive operation or two isolated regions for single phase drive operation, and the switches are driven to turn on at the exact same time and certain nodes are tied together for current sharing to ensure dynamic switching losses are shared equally across the devices. The only remaining variable in dynamic current sharing is the die to die variation in the Vgs threshold of the MOSFET. This cannot be removed by the gate drive design.

As shown in FIG. 8, whether in the single-phase configuration, corresponding to the gate driver circuit topology of FIG. 5B, or the independent configuration corresponding to the gate driver circuit topology of FIG. 5A, the gate driver power supply units 100A, 100B, 100C corresponding to respective U, V, W phases for high side power switching operations is shown in alignment and substantially equidistant spaced from each other. Located above the gate driver power supply units 100A, 100B, 100C corresponding to respective U, V, W phases are respective gate driver booster circuits 342A, 342B, 342C corresponding to respective U, V, W phases for high side power switching operations. Each of these gate driver booster circuits 342A, 342B, 342C are situated on PWB 12 in alignment and substantially equidistant spaced from each other and from the gate driver power supply units 100A, 100B, 100C. As further shown in FIG. 8, located above the respective gate driver booster circuits 342A, 342B, 342C corresponding to respective U, V, W phases for high side power switching operations are respective gate driver booster circuits 342D, 342E, 342F associated with corresponding respective U, V, W phases for low side power switching operations. Each of these gate driver booster circuits 342D, 342E, 342F are situated on PWB 12 in alignment and substantially equidistant spaced from each other and from the lower gate driver booster circuits 342A, 342B, 342C corresponding to respective U, V, W phases.

Further, located above the respective gate driver booster circuits 342D, 342E, 342F associated with corresponding respective U, V, W phases for low side power switching operations are situated respective gate driver power supply units 100D, 100E, 100F corresponding to respective U, V, W phases for low side power switching operations.

As further shown in FIG. 8, in the parallel connected configuration, located at several locations and interconnecting several trace conductors in the manner as described in connection with FIGS. 5A, 5B, 6A, 6B and 7 are the placement of the spanning resistors 175 which can be substantially 0.0 ohms single resistor devices or, a set of three series-connected resistor devices each of substantially 0.0 ohms. As mentioned, when configured for independent operation, these spanning resistors are de-populated. Further, in connection with the parallel connected configuration, only a single isolated gate driver IC is used to ensure the tight timing required for both the high side and low side switching power MOSFET operations. Thus, as shown in FIG. 8, there is shown the populating on the PWB 12 of the V-phase single isolated gate driver IC 325B for controlling high side gate driver switching operations, and similarly, the populating on the PWB 12 of the V-phase single isolated gate driver IC 325E for controlling low side gate driver switching operations. In this configuration, the corresponding U-phase single isolated gate driver IC 325A and W-phase single isolated gate driver IC 325C for high side load driving operations are de-populated from the PWB 12. Similarly, in this configuration, the corresponding U-phase single isolated gate driver IC 325D and W-phase single isolated gate driver IC 325F for low side load driving operations are de-populated from the PWB 12.

Notwithstanding the symmetry and specifically aligned and spaced gate driver and power supply components for configuring the single PWB 12 for two applications, the PWB 12 includes other circuits including, but not limited to: the Gate driver power supply unit low voltage side circuitry 502 which functions to provide the primary side of the isolated gate driver power supply to transfer energy into the transformer along with providing startup inrush current limiting and overcurrent fault protection; the gate drive isolation transformer 504 used for providing the galvanically isolated energy transfer from the low voltage side to multiple high voltage referenced output voltage rails; the gate driver power supply rectifiers 506 for the high voltage side which are used in the half-wave rectifiers at the power supply units for providing the power rails; and a backup flyback power supply (high voltage side) 508 which functions as a backup power supply for powering the low side gate drivers during a loss of control power while operating a PM machine. Further components situated on the single PWB 12 include digital isolator component including integrated circuits 510, 512 which functions to provide isolation for analog to digital converters that sample high voltage referenced temperature sense thermistors along with phase voltage feedback monitors, an isolated temperature sensor 515 which functions to provide direct measurement of the semiconductor die temperature on the substrate; a direct current link voltage monitor 520 which functions to assist in providing function for overvoltage on the DC Bus while the system has lost control power from the low voltage side; and a phase voltage monitor circuit 524 which functions to provide phase voltage feedback for monitoring the state of the semiconductor half bridge. A further PWB interface connector structure 550 is provided for receiving signals from the gate drive controller 300, by providing signals to the various gate power supply drive circuits and isolated gate drive IC 325 including command and control communication signals for controlling switching operations in the alternate configurations.

Thus, in one embodiment, the gate drive/power supply circuit hardware topology includes interconnected components laid out on the PWB 12 in a manner that is configurable for enabling six independently operating gate driver/power supply units that can be high voltage isolated and operated to provide three phase operation or configurable for parallel connection to provide current sharing to provide for tightly controlling single phase operation. In single phase parallel-connected operation, the three Hi side gate drive power supplies with linear regulators and three Lo side gate drive power supplies with linear regulators each have high rail outputs and low rail outputs operatively connected in parallel to provide current sharing to provide a single phase operation such that three gate drivers of each pair are switched at the same time and with each being operated to within a tight tolerance, e.g., within 4 mV of each other.

In one embodiment, by merely populating or de-populating components on a circuit board, the single PWB can be changed to a different gate drive configuration. In one embodiment, spanning resistors (e.g., sets of 3) are populated to connect common circuit components to provide the common rails used for single phase operation. When the sets of spanning resistors are removed from the circuit topology, the power supplies become isolated within a defined creepage distance providing sufficient high voltage isolation. The circuit layout and topology of the PWB is optimized to ensure tight tolerances (tight power supply regulation) including the current booster topology, the inner connections for pulling signals together to share current at the same time in the conduction portion of the waveform, and the gate driver switching controls are key to enabling the 3PG and 1 PG configurations on a single card. The circuit board is designed in a way to enable the current sharing and tight timings to avoid switching losses and permits modularity. The single common PWB saved time on the design cycle side such that only a single circuit card needed to go through a design cycle vs. two circuit cards going through the design cycle. On the production side, a single PWB will drive higher volumes of that part which in theory will reduce the cost of the PWB.

In the discussion and claims herein, the term "about" indicates that the value listed may be somewhat altered, as long as the alteration does not result in nonconformance of the process or device. For example, for some elements the term "about" can refer to a variation of ±0.1% for other elements, the term "about" can refer to a variation of ±1% or ±10%, or any point therein. For example, the term about when used for a measurement in mm, may include +/0.1, 0.2, 0.3, etc., where the difference between the stated number may be larger when the state number is larger. For example, about 1.5 may include 1.2-1.8, where about 20, may include 18.0-22.0.

As used herein, the term "substantially", or "substantial", is equally applicable when used in a negative connotation to refer to the complete or near complete lack of an action, characteristic, property, state, structure, item, or result. For example, a surface that is "substantially" flat would either completely flat, or so nearly flat that the effect would be the same as if it were completely flat. "Substantially" when referring to a shape or size may account for manufacturing where a perfect shapes, such as circular or sizes may be difficult to manufacture.

As used herein terms such as "a", "an" and "the" are not intended to refer to only a singular entity, but include the general class of which a specific example may be used for illustration. As used herein, terms defined in the singular are intended to include those terms defined in the plural and vice versa.

References in the specification to "one aspect", "certain aspects", "some aspects" or "an aspect", indicate that the aspect(s) described may include a particular feature or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

For purposes of the description hereinafter, the terms "upper", "lower", "right", "left", "vertical", "horizontal", "top", "bottom", and derivatives thereof shall relate to a device relative to a floor and/or as it is oriented in the figures or with respect to a surface.

Reference herein to any numerical range expressly includes each numerical value (including fractional numbers and whole numbers) encompassed by that range. To illustrate, reference herein to a range of "at least 50" or "at least about 50" includes whole numbers of 50, 51, 52, 53, 54, 55, 56, 57, 58, 59, 60, etc., and fractional numbers 50.1, 50.2 50.3, 50.4, 50.5, 50.6, 50.7, 50.8, 50.9, etc. In a further illustration, reference herein to a range of "less than 50" or "less than about 50" includes whole numbers 49, 48, 47, 46, 45, 44, 43, 42, 41, 40, etc., and fractional numbers 49.9, 49.8, 49.7, 49.6, 49.5, 49.4, 49.3, 49.2, 49.1, 49.0, etc.

The terminology used herein is for the purpose of describing particular embodiments only and is not intended to be limiting the scope of the disclosure and is not intended to be exhaustive. Many modifications and variations will be apparent to those of ordinary skill in the art without departing from the scope and spirit of the disclosure.

What is claimed is:

1. A configurable printed wiring board (PWB) for a power switching transistor device gate drive system, the PWB comprising:
a plurality of gate driver controls and associated power supply units at predetermined locations thereon, a respective gate driver control and associated power supply unit combination operable for independently driving a corresponding switching power transistor device operatively connected therewith to provide power to a connected load, each respective gate driver control and associated power supply unit combination having associated circuit topology located on said PWB such that, in a first PWB configuration, each respective gate driver control and power supply unit combination is electrically high voltage isolated for independently driving a corresponding connected switching power transistor device; and
multiple pairs of connection structures integrated within the PWB at predetermined locations of circuitry associated with each respective gate driver control and associated power supply unit combination, each connection structure of a respective pair accommodating physical installation of a terminal of a resistor device on said PWB,
wherein a first pair of connection structures permits a populating of a resistor component to electrically connect a power rail conductor associated with a first power supply unit to a like power rail conductor associated with a second power supply unit, and a second pair of connection structures permits a populating of a resistor component to electrically connect a conductor carrying a gate driver signal of a first gate driver control circuit used to control a first switching power transistor to a like conductor associated with a second gate driver control circuit for carrying a gate drive signal for controlling switching operation of corresponding connected second switching power transistor;

wherein each said first and second paired connection structures when populated with a respective resistor component configure a second PWB configuration comprising a parallel connection of said first switching power transistor device and second switching power transistor device to drive the load and permit said first and second power supply units to thereby share current for driving the parallel configured switching power transistor devices associated with each first and second power supply unit.

2. The configurable printed wiring board as claimed in claim 1, wherein said resistor component comprises a resistor value of approximately 0 ohms.

3. The configurable printed wiring board as claimed in claim 1, herein said power switching transistor device is one of: a MOSFET or an IGBT.

4. The configurable printed wiring board as claimed in claim 1, wherein said power rail conductor provides a positive voltage for powering components used for driving the parallel connected switching power transistor devices in a conductive state.

5. The configurable printed wiring board as claimed in claim 4, wherein
a third pair of connection structures permits an installing of a resistor component in said second configuration to electrically connect a further power rail conductor associated with the first power supply unit to a like further power rail conductor associated with the second power supply unit.

6. The configurable printed wiring board as claimed in claim 5, wherein said further power rail conductor provides a negative voltage for powering components used for driving the parallel connected switching power MOSFET devices in a non-conducting state.

7. The configurable printed wiring board as claimed in claim 6, wherein when in said second configuration, the first gate driver control circuit generates control signals for use in controlling switching of each said parallel switching power transistor devices.

8. The configurable printed wiring board as claimed in claim 7, wherein when in said second configuration, a second driver control IC associated with a parallel connected power switch for use in controlling switching of each said parallel switching power transistor devices is de-populated from said PWB.

9. The configurable printed wiring board as claimed in claim 7, wherein said first gate driver control circuitry comprises a boost circuit for boosting a current drive of said control signals used for switching power transistor devices, said PWB in said second configuration further comprising:
a fourth respective pair of connection structures permitting a resistor component to be installed to electrically connect a conductor carrying a boosted gate driver signal of the first gate driver control circuit to a corresponding like conductor on the second gate driver control circuit for driving both of said parallel connected switching power transistor devices.

10. The configurable printed wiring board as claimed in claim 9, wherein each respective associated power supply unit of a combination comprises a half-wave bridge rectifier circuit coupled with a linear regulator to provide a power rail voltage on said associated power rail conductor, said PWB in said second configuration further comprising:
a fifth respective pair of connection structures permitting a resistor component to be installed to electrically connect a conductor associated with setting input of the linear regulator to supply a power rail voltage of the first power supply unit to a like conductor associated with a setting input of a linear regulator power rail conductor associated with a second power supply unit.

* * * * *